(12) United States Patent
Jeddeloh

(10) Patent No.: US 7,873,775 B2
(45) Date of Patent: *Jan. 18, 2011

(54) MULTIPLE PROCESSOR SYSTEM AND METHOD INCLUDING MULTIPLE MEMORY HUB MODULES

(75) Inventor: Joseph M. Jeddeloh, Shoreview, MN (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/505,933

(22) Filed: Jul. 20, 2009

(65) Prior Publication Data

US 2009/0282182 A1      Nov. 12, 2009

Related U.S. Application Data

(63) Continuation of application No. 12/002,849, filed on Dec. 18, 2007, now Pat. No. 7,581,055, which is a continuation of application No. 11/544,352, filed on Oct. 5, 2006, now Pat. No. 7,386,649, which is a continuation of application No. 10/653,044, filed on Aug. 28, 2003, now Pat. No. 7,136,958.

(51) Int. Cl.
*G06F 13/00* (2006.01)
*G06F 13/28* (2006.01)
(52) U.S. Cl. .................. 710/317; 711/117; 711/170
(58) Field of Classification Search ........... 710/317; 711/117, 170
See application file for complete search history.

(56) References Cited

U.S. PATENT DOCUMENTS 3,742,253 A * 6/1973 Kronies .................. 327/217

| 4,045,781 | A | 8/1977 | Levy et al. ............ 364/200 |
| 4,078,228 | A | 3/1978 | Miyazaki ............. 340/147 R |
| 4,240,143 | A | 12/1980 | Besemer et al. ........ 364/200 |
| 4,245,306 | A | 1/1981 | Besemer et al. ........ 364/200 |

(Continued)

FOREIGN PATENT DOCUMENTS

| EP | 0709786 A1 | 5/1996 |
| EP | 0849685 A2 | 6/1998 |
| EP | 0 910 021 A1 | 4/1999 |
| JP | 06-104707 | 4/1994 |
| JP | 2001265539 A | 9/2001 |

(Continued)

OTHER PUBLICATIONS

"Free On-Line Dictionary of Computing" entry 'Flash Erasable Programmable Read-Only Memory, online May 17, 2004 [http://foldoc.doc.ic.ac.uk/foldoc/foldoc.cgi?flash+memory].

(Continued)

*Primary Examiner*—Mark Rinehart
*Assistant Examiner*—Jeremy S Cerullo
(74) *Attorney, Agent, or Firm*—Lerner, David, Littenberg, Krumholz & Mentlik, LLP

(57) ABSTRACT

A processor-based electronic system includes several memory modules arranged in first and second ranks. The memory modules in the first rank are directly accessed by any of several processors, and the memory modules in the second rank are accessed by the processors through the memory modules in the first rank. The data bandwidth between the processors and the memory modules in the second rank is varied by varying the number of memory modules in the first rank that are used to access the memory module in the second set. Each of the memory modules includes several memory devices coupled to a memory hub. The memory hub includes a memory controller coupled to each memory device, a link interface coupled to a respective processor or memory module, and a cross bar switch coupling any of the memory controllers to any of the link interfaces.

17 Claims, 6 Drawing Sheets

U.S. PATENT DOCUMENTS

| | | | |
|---|---|---|---|
| 4,253,144 A | 2/1981 | Bellamy et al. | 364/200 |
| 4,253,146 A | 2/1981 | Bellamy et al. | 364/200 |
| 4,608,702 A | 8/1986 | Hirzel et al. | 375/110 |
| 4,707,823 A | 11/1987 | Holdren et al. | 370/1 |
| 4,724,520 A | 2/1988 | Athanas et al. | 364/200 |
| 4,831,520 A * | 5/1989 | Rubinfeld et al. | 710/305 |
| 4,843,263 A | 6/1989 | Ando | 327/297 |
| 4,891,808 A | 1/1990 | Williams | 370/112 |
| 4,930,128 A | 5/1990 | Suzuki et al. | 371/12 |
| 4,953,930 A | 9/1990 | Ramsey et al. | 350/96.11 |
| 4,982,185 A | 1/1991 | Holmberg et al. | 340/825.21 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,299,293 A | 3/1994 | Mestdagh et al. | 359/110 |
| 5,313,590 A * | 5/1994 | Taylor | 710/317 |
| 5,317,752 A | 5/1994 | Jewett et al. | 395/750 |
| 5,319,755 A | 6/1994 | Farmwald et al. | 395/325 |
| 5,355,391 A | 10/1994 | Horowitz et al. | 375/36 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,497,476 A | 3/1996 | Oldfield et al. | 395/439 |
| 5,502,621 A | 3/1996 | Schumacher et al. | 361/760 |
| 5,544,319 A | 8/1996 | Acton et al. | 395/200.07 |
| 5,566,325 A | 10/1996 | Bruce, II et al. | 395/494 |
| 5,577,220 A | 11/1996 | Combs et al. | 395/416 |
| 5,581,767 A | 12/1996 | Katsuki et al. | 395/800 |
| 5,606,717 A | 2/1997 | Farmwald et al. | 395/856 |
| 5,638,334 A | 6/1997 | Farmwald et al. | 365/230.03 |
| 5,638,534 A | 6/1997 | Mote, Jr. | 395/485 |
| 5,659,798 A | 8/1997 | Blumrich et al. | 395/846 |
| 5,687,325 A * | 11/1997 | Chang | 710/104 |
| 5,706,224 A | 1/1998 | Srinivasan et al. | 365/49 |
| 5,710,733 A | 1/1998 | Chengson et al. | 365/52 |
| 5,715,456 A | 2/1998 | Bennett et al. | 395/652 |
| 5,729,709 A | 3/1998 | Harness | 395/405 |
| 5,748,616 A | 5/1998 | Riley | 370/242 |
| 5,796,413 A | 8/1998 | Shipp et al. | 345/522 |
| 5,818,844 A | 10/1998 | Singh et al. | 370/463 |
| 5,819,304 A | 10/1998 | Nilsen et al. | 711/5 |
| 5,822,255 A | 10/1998 | Uchida | 365/194 |
| 5,832,250 A | 11/1998 | Whittaker | 395/471 |
| 5,875,352 A | 2/1999 | Gentry et al. | 395/843 |
| 5,875,454 A | 2/1999 | Craft et al. | 711/113 |
| 5,887,159 A | 3/1999 | Burrows | 395/567 |
| 5,928,343 A | 7/1999 | Farmwald et al. | 710/104 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,011,741 A | 1/2000 | Wallace et al. | 365/221 |
| 6,014,721 A | 1/2000 | Arimilli et al. | 710/315 |
| 6,023,726 A | 2/2000 | Saksena | 709/219 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,038,630 A * | 3/2000 | Foster et al. | 710/317 |
| 6,061,263 A | 5/2000 | Boaz et al. | 365/51 |
| 6,061,296 A | 5/2000 | Ternullo, Jr. et al. | 365/233 |
| 6,064,706 A | 5/2000 | Driskill et al. | 375/372 |
| 6,067,262 A | 5/2000 | Irrinki et al. | 365/201 |
| 6,067,649 A | 5/2000 | Goodwin | 714/718 |
| 6,073,190 A | 6/2000 | Rooney | 710/56 |
| 6,076,139 A | 6/2000 | Welker et al. | 711/104 |
| 6,079,008 A | 6/2000 | Clery, III | 712/11 |
| 6,092,158 A | 7/2000 | Harriman et al. | 711/151 |
| 6,098,158 A | 8/2000 | Lay et al. | 711/162 |
| 6,100,735 A | 8/2000 | Lu | 327/158 |
| 6,105,075 A | 8/2000 | Ghaffari | 710/5 |
| 6,125,431 A | 9/2000 | Kobayashi | 711/154 |
| 6,128,703 A | 10/2000 | Bourekas et al. | 711/138 |
| 6,134,624 A | 10/2000 | Burns et al. | 710/131 |
| 6,137,709 A | 10/2000 | Boaz et al. | 365/51 |
| 6,144,587 A | 11/2000 | Yoshida | 365/189.05 |
| 6,167,465 A | 12/2000 | Parvin et al. | 710/22 |
| 6,167,486 A | 12/2000 | Lee et al. | 711/120 |
| 6,175,571 B1 | 1/2001 | Haddock et al. | 370/423 |
| 6,185,352 B1 | 2/2001 | Hurley | 385/114 |
| 6,185,676 B1 | 2/2001 | Poplingher et al. | 712/239 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,208,180 B1 | 3/2001 | Fisch et al. | 327/141 |
| 6,223,301 B1 | 4/2001 | Santeler et al. | 714/6 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,256,325 B1 | 7/2001 | Park | 370/503 |
| 6,256,692 B1 | 7/2001 | Yoda et al. | 710/104 |
| 6,272,600 B1 | 8/2001 | Talbot et al. | 711/140 |
| 6,272,609 B1 | 8/2001 | Jeddeloh | 711/169 |
| 6,278,755 B1 | 8/2001 | Baba et al. | 375/360 |
| 6,285,349 B1 | 9/2001 | Smith | 345/147 |
| 6,286,083 B1 | 9/2001 | Chin et al. | 711/151 |
| 6,289,068 B1 | 9/2001 | Hassoun et al. | 375/376 |
| 6,294,937 B1 | 9/2001 | Crafts et al. | 327/158 |
| 6,301,637 B1 | 10/2001 | Krull et al. | 711/112 |
| 6,324,485 B1 | 11/2001 | Ellis | 702/117 |
| 6,327,642 B1 | 12/2001 | Lee et al. | 711/120 |
| 6,327,650 B1 | 12/2001 | Bapst et al. | 712/228 |
| 6,330,205 B2 | 12/2001 | Shimizu et al. | 365/230.06 |
| 6,347,055 B1 | 2/2002 | Motomura | 365/189.05 |
| 6,349,363 B2 | 2/2002 | Cai et al. | 711/129 |
| 6,356,573 B1 | 3/2002 | Jonsson et al. | 372/46 |
| 6,367,074 B1 | 4/2002 | Bates et al. | 717/11 |
| 6,370,068 B2 | 4/2002 | Rhee | 365/196 |
| 6,370,611 B1 | 4/2002 | Callison et al. | 711/105 |
| 6,373,777 B1 | 4/2002 | Suzuki | 365/230.03 |
| 6,381,190 B1 | 4/2002 | Shinkai | 365/230.03 |
| 6,389,514 B1 | 5/2002 | Rokicki | 711/136 |
| 6,392,653 B1 | 5/2002 | Malandain et al. | 345/501 |
| 6,401,213 B1 | 6/2002 | Jeddeloh | 713/401 |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,433,785 B1 | 8/2002 | Garcia et al. | 345/531 |
| 6,434,639 B1 | 8/2002 | Haghighi | 710/39 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,449,308 B1 | 9/2002 | Knight, Jr. et al. | 375/212 |
| 6,453,393 B1 | 9/2002 | Holman et al. | 711/154 |
| 6,460,114 B1 | 10/2002 | Jeddeloh | 711/120 |
| 6,462,978 B2 | 10/2002 | Shibata et al. | 365/63 |
| 6,463,059 B1 | 10/2002 | Movshovich et al. | 370/389 |
| 6,467,013 B1 | 10/2002 | Nizar | 711/1 |
| 6,470,422 B2 | 10/2002 | Cai et al. | 711/129 |
| 6,473,828 B1 | 10/2002 | Matsui | 711/104 |
| 6,477,592 B1 * | 11/2002 | Chen et al. | 710/52 |
| 6,477,614 B1 | 11/2002 | Leddige et al. | 711/5 |
| 6,477,621 B1 | 11/2002 | Lee et al. | 711/120 |
| 6,479,322 B2 | 11/2002 | Kawata et al. | 438/109 |
| 6,487,556 B1 * | 11/2002 | Downs et al. | 707/101 |
| 6,490,188 B2 | 12/2002 | Nuxoll et al. | 365/63 |

| | | | |
|---|---|---|---|
| 6,496,193 B1 | 12/2002 | Surti et al. | 345/552 |
| 6,496,909 B1 | 12/2002 | Schimmel | 711/163 |
| 6,501,471 B1 | 12/2002 | Venkataraman et al. | 345/424 |
| 6,505,287 B2 | 1/2003 | Uematsu | 711/170 |
| 6,523,092 B1 | 2/2003 | Fanning | 711/134 |
| 6,523,093 B1 | 2/2003 | Bogin et al. | 711/137 |
| 6,526,483 B1 | 2/2003 | Cho et al. | 711/154 |
| 6,539,490 B1 | 3/2003 | Forbes et al. | 713/401 |
| 6,552,564 B1 | 4/2003 | Forbes et al. | 326/30 |
| 6,587,912 B2 | 7/2003 | Leddige et al. | 711/5 |
| 6,590,816 B2 | 7/2003 | Perner | 365/200 |
| 6,594,713 B1 | 7/2003 | Fuoco et al. | 710/31 |
| 6,594,722 B1 | 7/2003 | Willke, II et al. | 710/313 |
| 6,598,154 B1 | 7/2003 | Vaid et al. | 712/237 |
| 6,615,325 B2 | 9/2003 | Mailloux et al. | 711/154 |
| 6,622,186 B1 | 9/2003 | Moniot et al. | 710/52 |
| 6,622,188 B1 | 9/2003 | Goodwin et al. | 710/101 |
| 6,622,227 B2 | 9/2003 | Zumkehr et al. | 711/167 |
| 6,628,294 B1 | 9/2003 | Sadowsky et al. | 345/568 |
| 6,629,220 B1 | 9/2003 | Dyer | 711/158 |
| 6,631,440 B2 | 10/2003 | Jenne et al. | 711/105 |
| 6,636,110 B1 | 10/2003 | Ooishi et al. | 327/565 |
| 6,636,912 B2 | 10/2003 | Ajanovic et al. | 710/105 |
| 6,646,929 B1 | 11/2003 | Moss et al. | 365/194 |
| 6,647,470 B1 | 11/2003 | Janzen | 711/154 |
| 6,658,509 B1 | 12/2003 | Bonella et al. | 710/100 |
| 6,662,304 B2 | 12/2003 | Keeth et al. | 713/400 |
| 6,665,202 B2 | 12/2003 | Lindahl et al. | 365/49 |
| 6,667,895 B2 | 12/2003 | Jang et al. | 365/63 |
| 6,667,926 B1 | 12/2003 | Chen et al. | 365/221 |
| 6,670,833 B2 | 12/2003 | Kurd et al. | 327/156 |
| 6,681,292 B2 | 1/2004 | Creta et al. | 711/119 |
| 6,697,926 B2 | 2/2004 | Johnson et al. | 711/167 |
| 6,715,018 B2 | 3/2004 | Farnworth et al. | 710/300 |
| 6,718,440 B2 | 4/2004 | Maiyuran et al. | 711/137 |
| 6,721,195 B2 | 4/2004 | Brunelle et al. | 365/63 |
| 6,721,860 B2 | 4/2004 | Klein | 711/154 |
| 6,724,685 B2 | 4/2004 | Braun et al. | 365/233 |
| 6,728,800 B1 | 4/2004 | Lee et al. | 710/54 |
| 6,735,679 B1 | 5/2004 | Herbst et al. | 711/167 |
| 6,735,682 B2 | 5/2004 | Segelken et al. | 711/220 |
| 6,742,098 B1 | 5/2004 | Halbert et al. | 711/172 |
| 6,745,275 B2 | 6/2004 | Chang | 710/305 |
| 6,751,703 B2 | 6/2004 | Chilton | 711/113 |
| 6,754,812 B1 | 6/2004 | Abdallah et al. | 712/234 |
| 6,756,661 B2 | 6/2004 | Tsuneda et al. | 257/673 |
| 6,760,833 B1 | 7/2004 | Dowling | 712/34 |
| 6,771,538 B2 | 8/2004 | Shukuri et al. | 365/185.05 |
| 6,775,747 B2 | 8/2004 | Venkatraman | 711/137 |
| 6,782,435 B2 | 8/2004 | Garcia et al. | 710/33 |
| 6,785,780 B1 | 8/2004 | Klein et al. | 711/148 |
| 6,789,173 B1 | 9/2004 | Tanaka et al. | 711/147 |
| 6,792,059 B2 | 9/2004 | Yuan et al. | 375/354 |
| 6,792,496 B2 | 9/2004 | Aboulenein et al. | 710/306 |
| 6,795,899 B2 | 9/2004 | Dodd et al. | 711/137 |
| 6,799,246 B1 | 9/2004 | Wise et al. | 711/117 |
| 6,799,268 B1 | 9/2004 | Boggs et al. | 712/228 |
| 6,804,760 B2 | 10/2004 | Wiliams | 711/170 |
| 6,804,764 B2 | 10/2004 | LaBerge et al. | 711/170 |
| 6,807,630 B2 | 10/2004 | Lay et al. | 713/2 |
| 6,811,320 B1 | 11/2004 | Abbott | 385/58 |
| 6,816,947 B1 | 11/2004 | Huffman | 711/151 |
| 6,820,181 B2 | 11/2004 | Jeddeloh et al. | 711/169 |
| 6,821,029 B1 | 11/2004 | Grung et al. | 385/92 |
| 6,823,023 B1 | 11/2004 | Hannah | 375/296 |
| 6,845,409 B1 | 1/2005 | Talagala et al. | 710/20 |
| 6,901,494 B2 | 5/2005 | Zumkehr et al. | 711/167 |
| 6,904,556 B2 | 6/2005 | Walton et al. | 714/766 |
| 6,910,109 B2 | 6/2005 | Holman et al. | 711/156 |
| 6,912,612 B2 | 6/2005 | Kapur et al. | 710/309 |
| 6,947,672 B2 | 9/2005 | Jiang et al. | 398/135 |
| 6,980,042 B2 | 12/2005 | LaBerge | 327/291 |
| 7,046,060 B1 | 5/2006 | Minzoni et al. | 327/158 |
| 7,068,085 B2 | 6/2006 | Gomm et al. | 327/158 |
| 7,116,143 B2 | 10/2006 | Deivasigamani et al. | 327/149 |
| 7,120,743 B2 | 10/2006 | Meyer et al. | 711/118 |
| 7,133,991 B2 | 11/2006 | James | 711/167 |
| 7,136,958 B2 * | 11/2006 | Jeddeloh | 710/317 |
| 7,149,874 B2 | 12/2006 | Jeddeloh | 711/220 |
| 7,181,584 B2 | 2/2007 | LaBerge | 711/167 |
| 7,187,742 B1 | 3/2007 | Logue et al. | 375/376 |
| 7,386,649 B2 * | 6/2008 | Jeddeloh | 710/317 |
| 7,581,055 B2 * | 8/2009 | Jeddeloh | 710/317 |
| 2001/0038611 A1 | 11/2001 | Darcie et al. | 370/248 |
| 2001/0039612 A1 | 11/2001 | Lee | 713/2 |
| 2002/0016885 A1 | 2/2002 | Ryan et al. | 711/105 |
| 2002/0112119 A1 | 8/2002 | Halbert et al. | 711/115 |
| 2002/0116588 A1 | 8/2002 | Beckert et al. | 711/161 |
| 2002/0144064 A1 | 10/2002 | Fanning | 711/144 |
| 2002/0178319 A1 | 11/2002 | Sanchez-Olea | 710/305 |
| 2003/0005223 A1 | 1/2003 | Coulson et al. | 711/118 |
| 2003/0005344 A1 | 1/2003 | Bhamidipati et al. | 713/400 |
| 2003/0043158 A1 | 3/2003 | Wasserman et al. | 345/545 |
| 2003/0043426 A1 | 3/2003 | Baker et al. | 359/109 |
| 2003/0093630 A1 | 5/2003 | Richard et al. | 711/154 |
| 2003/0149809 A1 | 8/2003 | Jensen et al. | 710/22 |
| 2003/0156581 A1 | 8/2003 | Osborne | 370/389 |
| 2003/0163649 A1 | 8/2003 | Kapur et al. | 711/146 |
| 2003/0177320 A1 | 9/2003 | Sah et al. | 711/158 |
| 2003/0193927 A1 | 10/2003 | Hronik | 370/351 |
| 2003/0217223 A1 | 11/2003 | Nino, Jr. et al. | 711/105 |
| 2003/0229762 A1 | 12/2003 | Maiyuran et al. | 711/137 |
| 2003/0229770 A1 | 12/2003 | Jeddeloh | 711/213 |
| 2004/0022094 A1 | 2/2004 | Radhakrishnan et al. | 365/200 |
| 2004/0024948 A1 | 2/2004 | Winkler et al. | 710/311 |
| 2004/0047169 A1 | 3/2004 | Lee et al. | 365/63 |
| 2004/0107306 A1 | 6/2004 | Barth et al. | 710/310 |
| 2004/0126115 A1 | 7/2004 | Levy et al. | 398/116 |
| 2004/0128449 A1 | 7/2004 | Osborne et al. | 711/137 |
| 2004/0144994 A1 | 7/2004 | Lee et al. | 257/200 |
| 2004/0160206 A1 | 8/2004 | Komaki et al. | 318/569 |
| 2004/0193821 A1 | 9/2004 | Ruhovets et al. | 711/167 |
| 2004/0225847 A1 | 11/2004 | Wastlick et al. | 711/158 |
| 2004/0230718 A1 | 11/2004 | Polzin et al. | 710/22 |
| 2004/0236885 A1 | 11/2004 | Fredriksson et al. | 710/100 |
| 2004/0251936 A1 | 12/2004 | Gomm | 327/141 |
| 2005/0015426 A1 | 1/2005 | Woodruff et al. | 709/200 |
| 2005/0071542 A1 | 3/2005 | Weber et al. | 711/105 |
| 2005/0105350 A1 | 5/2005 | Zimmerman | 365/201 |
| 2005/0122153 A1 | 6/2005 | Lin | 327/291 |
| 2005/0132159 A1 | 6/2005 | Jeddeloh | 711/167 |
| 2005/0149603 A1 | 7/2005 | DeSota et al. | 709/200 |
| 2005/0162882 A1 | 7/2005 | Reeves et al. | 365/63 |
| 2005/0166006 A1 | 7/2005 | Talbot et al. | 711/105 |
| 2005/0177677 A1 | 8/2005 | Jeddeloh | 711/100 |
| 2005/0177695 A1 | 8/2005 | Larson et al. | 711/167 |
| 2005/0213611 A1 | 9/2005 | James | 370/503 |
| 2005/0216677 A1 | 9/2005 | Jeddeloh et al. | 711/150 |
| 2005/0268060 A1 | 12/2005 | Cronin et al. | 711/167 |
| 2006/0022724 A1 | 2/2006 | Zerbe et al. | 327/141 |
| 2006/0066375 A1 | 3/2006 | LaBerge | 327/291 |
| 2006/0136683 A1 | 6/2006 | Meyer et al. | 711/154 |
| 2006/0174070 A1 | 8/2006 | Jeddeloh | 711/150 |
| 2006/0200602 A1 | 9/2006 | James | 710/71 |
| 2006/0218318 A1 | 9/2006 | James | 710/58 |
| 2006/0271746 A1 | 11/2006 | Meyer et al. | 711/148 |
| 2009/0013211 A1 | 1/2009 | Vogt et al. | 714/5 |

FOREIGN PATENT DOCUMENTS

| | | |
|---|---|---|
| WO | WO 93/19422 | 9/1993 |
| WO | 02/23353 A2 | 3/2002 |

WO WO 02/27499 A2 4/2002

OTHER PUBLICATIONS

Intel, "Flash Memory PCI Add-In Card for Embedded Systems", Application Note AP-758, Sep. 1997, pp. i-13.

Intel, "Intel 840 Chipset: 82840 Memory Controller Hub (MCH)", Datasheet, www.intel.com/design/chipsets/datashts/298020.htm, Oct. 1999, pp. 1-178.

Micron Technology, Inc., "Synchronous DRAM Module 512MB/1GB (x72, ECC) 168-PIN Registered FBGA SDRAM DIMM", Micron Technology, Inc., 2002, pp. 1-23.

Rambus, Inc., "Direct Rambus™ Technology Disclosure", Oct. 1997. pp. 1-16.

Shanley, T. et al., "PCI System Architecture", Third Edition, Mindshare, Inc., 1995, pp. 24-25.

* cited by examiner

4 HDIMMS        16 HDIMMS

MULTIPLE PROCESSOR SYSTEM AND METHOD INCLUDING MULTIPLE MEMORY HUB MODULES

CROSS-REFERENCE TO RELATED APPLICATIONS

This application is a continuation of U.S. patent application Ser. No. 12/002,849, filed Dec. 18, 2007, U.S. Pat. No. 7,581,055, which is a continuation of U.S. patent application Ser. No. 11/544,352, filed Oct. 5, 2006, U.S. Pat. No. 7,386,649, which is a continuation of U.S. patent application Ser. No. 10/653,044, filed Aug. 28, 2003, U.S. Pat. No. 7,136,958. These applications are incorporated by reference herein.

TECHNICAL FIELD

This invention relates to computer systems, and, more particularly, to a computer system having several processors or other memory access devices that can be coupled to several memory hub modules in a variety of configurations.

BACKGROUND OF THE INVENTION

Computer systems use memory devices, such as dynamic random access memory ("DRAM") devices, to store instructions and data that are accessed by a processor. These memory devices are normally used as system memory in a computer system. In a typical computer system, the processor communicates with the system memory through a processor bus and a memory controller. The processor issues a memory request, which includes a memory command, such as a read command, and an address designating the location from which data or instructions are to be read or to which data or instructions are to be written. The memory controller uses the command and address to generate appropriate command signals as well as row and column addresses, which are applied to the system memory. In response to the commands and addresses, data are transferred between the system memory and the processor. The memory controller is often part of a system controller, which also includes bus bridge circuitry for coupling the processor bus to an expansion bus, such as a PCI bus.

Although the operating speed of memory devices has continuously increased, this increase in operating speed has not kept pace with increases in the operating speed of processors. As a result, the data bandwidth between a processor and memory devices to which it is coupled is significantly lower than the data bandwidth capabilities of the processor. The data bandwidth between the processor and memory devices is limited to a greater degree by the even lower data bandwidth between the processor and the memory devices.

In addition to the limited bandwidth between processors and memory devices, the performance of computer systems is also limited by latency problems that increase the time required to read data from the memory devices. More specifically, when a memory device read command is coupled to a memory device, such as a synchronous DRAM ("SDRAM") device, the read data are output from the SDRAM device only after a delay of several clock periods. Therefore, although SDRAM devices can synchronously output burst data at a high data rate, the delay in initially providing the data can significantly slow the operating speed of a computer system using such SDRAM devices.

One approach to alleviating the memory latency problem is illustrated in FIG. 1. As shown in FIG. 1, a computer system 10 includes a processor 14 coupled to several memory modules 20a-f, although a lesser or greater number of memory modules 20 may be used. Each of the memory modules 20 includes a memory hub 24 coupled to several memory devices 28, which may be SDRAM devices. The memory modules 20 are shown in FIG. 1 as being coupled to the processor 14 and to each other 20 through unidirectional input buses 30 and unidirectional output buses 38. However, it will be understood that the memory modules 20 may be coupled to the processor 14 and to each other by bi-directional buses (not shown).

The memory modules 20 are shown in FIG. 1 as being coupled in a point-to-point arrangement in which each bus 30, 38 is coupled only between two points. However, other bus system may alternatively be used. For example, a switched bus system as shown in FIG. 2A, a shared bus system as shown in FIG. 2B, or some other bus system may also be used. The switched bus system shown in FIG. 2A includes a processor 40 coupled to a switching circuit 42. The switching circuit 42 is coupled to several memory modules 44a-d, a graphics processor 46 and an I/O device 48. In operation, the switching circuit 42 couples the processor 40 to either one of the memory modules 44a-d, the graphics processor 46 or the I/O device 48. The shared bus system shown in FIG. 2B includes a processor 50 coupled to several memory modules 54a-c through a shared bus system 58.

Any of the above-described architectures may also be used to couple multiple processors to multiple memory modules. For example, as shown in FIG. 3, a pair of a processors 60, 62 are coupled through respective bi-directional bus systems 64 to respective sets of memory modules 66a-e, 68a-e. Each of the memory modules 66a-e, 68a-e includes a memory hub 24 coupled to several memory devices 28.

A memory hub architecture as shown in FIGS. 1 and 3 can provide performance that is far superior to architectures in which a processor is coupled to several memory devices, either directly or through a system or memory controller. However, they nevertheless suffer from several limitations. For example, the architecture shown in FIG. 1 does not provide a great deal of flexibility in the manner in which the processor 14 can access the memory modules 20a-f. If, for example, the buses 30-38 include a 32-bit data bus, all accesses to the memory modules 20a-f will be in 32-bit double words even if a lesser number a data bits are being read from or written to the memory modules 20a-f.

The flexibility of the architectures shown in FIGS. 1 and 3 are also limited in other respects. For example, the architecture shown in FIG. 3 does not provide a great deal of flexibility in the manner in which the processors 60, 62 can access the memory modules 66a-e, 68a-e, respectively. Although the processor 60 can access any of the memory modules 66a-f, and the processor 62 can access any of the memory modules 68a-e, the processor 60 cannot access any of the memory modules 68a-e nor can the processor 62 access any of the memory modules 66a-e. As a result, if the processor 60 writes sufficient data to the memory modules 66a-e to reach the storage capacity of the modules 66a-e, the processor 60 will be unable to store any further data even though there may be substantial unused capacity in the memory modules 68a-e. Finally, the memory modules 66, 68 cannot be used to allow the processors 60, 62 to communicate with each other.

Another limitation of the memory architectures shown in FIGS. 1 and 3 is the relatively high latency that the processors 14, 60, 62 incur in accessing their respective memory modules 20, 66, 68. Insofar as each memory module is accessed through any memory module that is between it and the processor, substantial delays may be incurred in coupling address, data and control signals through the intervening memory modules. Further, if any of the memory modules 20, 66, 68 becomes defective, the memory modules that must be accessed through the defective memory module become unusable.

There is therefore a need for a memory system architecture that is relatively fault-intolerant, that provides relatively low latency memory accesses, an that allows multiple processor to have a great deal of flexibility in the manner in which they access hub-based memory modules.

SUMMARY OF THE INVENTION

A memory system includes a plurality of memory requestors coupled to a first rank of memory modules. The memory modules in the first rank each include a first set of memory ports corresponding in number to the number of memory requesters. Each of the memory ports in the first rank is coupled to a respective one of the memory requesters. The memory modules in the first rank further include a second set of memory ports. The memory system also includes a second rank of memory modules each of which has at least one memory port coupled to at least one memory module in the first rank through a memory port in the second set. Each of the memory modules in the first and second ranks include a plurality of memory devices and a memory hub coupled to the memory devices and to the memory ports in the first set and any second set. The memory hub preferably includes a plurality of memory controllers coupled to respective memory devices in the module, a plurality of link interfaces each of which is coupled to either one of the memory requestors or another module, and a cross bar switch having a first plurality of switch ports coupled to respective link interfaces and a plurality of memory ports coupled to respective memory controllers. The cross bar switch is operable to selectively couple each of the link interfaces to any one of the memory controllers.

DETAILED DESCRIPTION OF THE INVENTION

Figure 4:
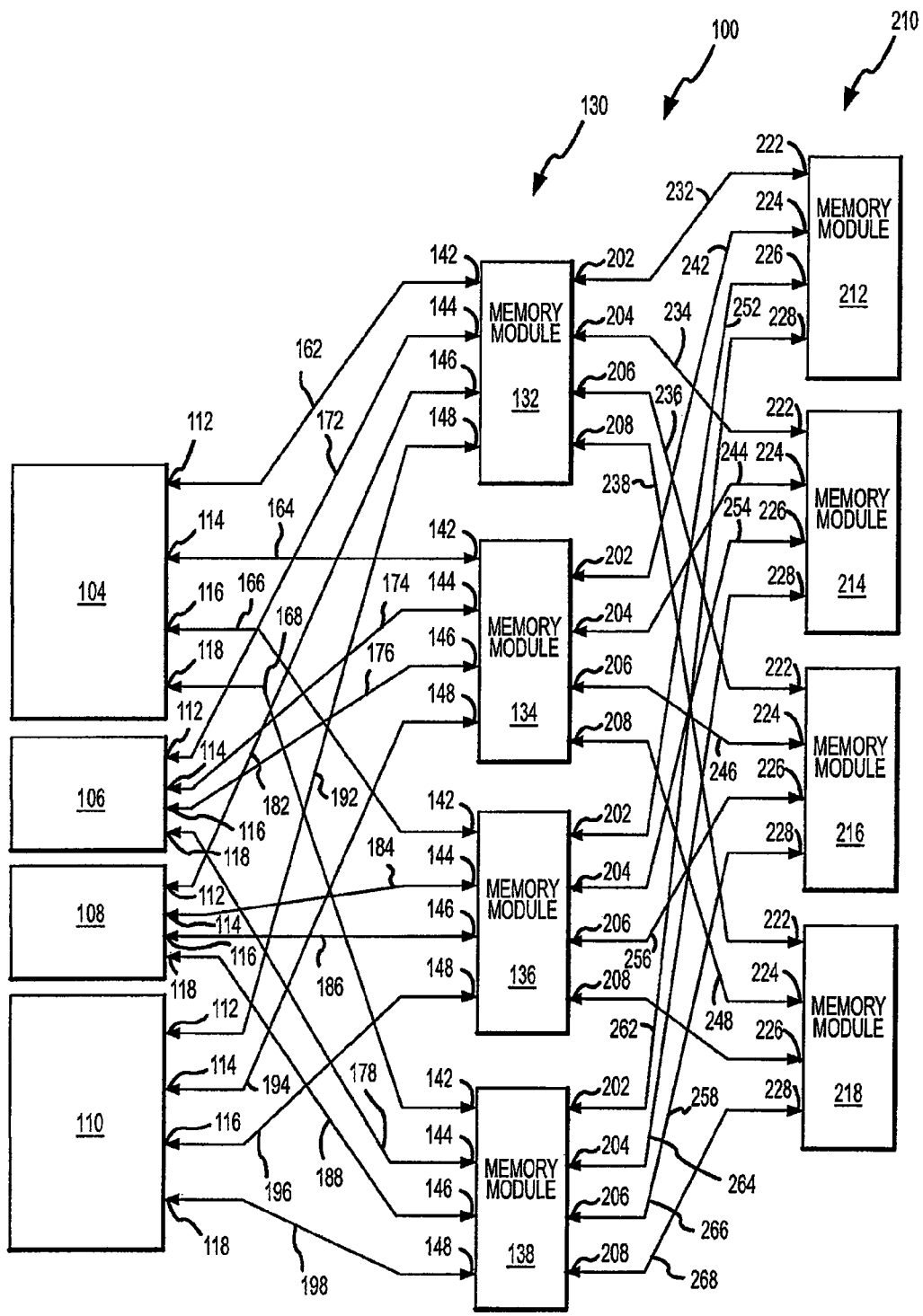
FIG. 4 is a block diagram of a processor-based system coupled to several memory modules according to one embodiment of the invention.

A processor-based electronic system 100 according to one example of the invention is shown in FIG. 4. The system 100 includes three processors 104, 106, 108 and a direct memory access ("DMA") device 110, such as a graphics controller. The DMA device 110 and each of the processors 104-108 includes four memory access ports 112, 114, 116, 118. The ports 112-118 preferably include a data port as well as either individual or a shared control and address ports. However, it will be understood that some other memory port configuration may be used, such as a port for receiving and transmitting packets. The system 100 also includes a first rank 130 of four memory modules 132, 134, 136, 138 each of which includes a first set of four memory access ports 142, 144, 146, 148. As explained below, each of the memory modules 132-138 includes a memory hub coupled to eight memory devices, which are preferably dynamic random access memory ("DRAM") devices, and, more preferably, synchronous DRAM ("SDRAM") devices. However, it will be understood that a greater or lesser number of memory devices may be coupled to the memory hub in each of the memory modules 132-138.

The memory access ports 112, 114, 116, 118 of the first processor 104 are coupled to the memory access port 142 of each of the memory modules 132, 134, 136, 138, respectively, through respective buses 162, 164, 166, 168. Similarly, the memory access ports 112, 114, 116, 118 of the second processor 106 are coupled to the memory access port 144 of each of the memory modules 132, 134, 136, 138, respectively, through respective buses 172, 174, 176, 178, and the memory access ports 112, 114, 116, 118 of the third processor 108 are coupled to the memory access port 146 of each of the memory modules 132, 134, 136, 138, respectively, through respective buses 182, 184, 186, 188. As a result, any of the processors 102-106 can access any of the memory modules 132-138. In a like manner, the memory access ports 112, 114, 116, 118 of the DMA device 110 are coupled to the memory access port 148 of each of the memory modules 132, 134, 136, 138, respectively, through respective buses 192, 194, 196, 198. Thus, the DMA device 108 can also access each of the memory modules 132, 134, 136, 138.

Each of the memory modules 132, 134, 136, 138 also includes a second set of four memory access ports 202, 204, 206, 208 that are coupled to a second rank 210 of four memory modules 212, 214, 216, 218. More specifically, the memory access ports 202, 204, 206, 208 of the memory module 132 are coupled to a respective memory access port 222 of the memory modules 212, 214, 216, 218, respectively, through respective buses 232, 234, 236, 238. Similarly, the memory access ports 202, 204, 206, 208 of the memory module 134 are coupled to the memory access port 224 of each of the memory modules 212, 214, 216, 218, respectively, through respective buses 242, 244, 246, 248, and the memory access ports 202, 204, 206, 208 of the memory module 136 are coupled to the memory access port 226 of each of the memory modules 212, 214, 216, 218, respectively, through respective buses 252, 254, 256, 258. Finally, the memory access ports 202, 204, 206, 208 of the memory module 138 are coupled to the memory access port 228 of each of the memory modules 212, 214, 216, 218, respectively, through respective buses 262, 264, 266, 268.

Each of the memory modules 212-218 in the second rank 210, like the memory modules 132-138 in the first rank 130, includes a memory hub coupled to eight memory devices. As explained in greater detail below, each of the memory hubs in the first rank 130 of memory modules 132-138 includes a crossbar switch (not shown in FIG. 4) that can couple any of the memory access ports 112-118 to any of the memory access ports 202-208. In the same manner, a memory hub in each of the memory modules 212-218 in the second rank 210 can couple any of the memory access ports 202-208 to any of the memory access ports 222-228. As a result, any of the processors 102-106 and the DMA device 108 can access any of the memory modules 132-138 directly and any of the memory modules 212-218 through the memory modules 132-

Figure 1:
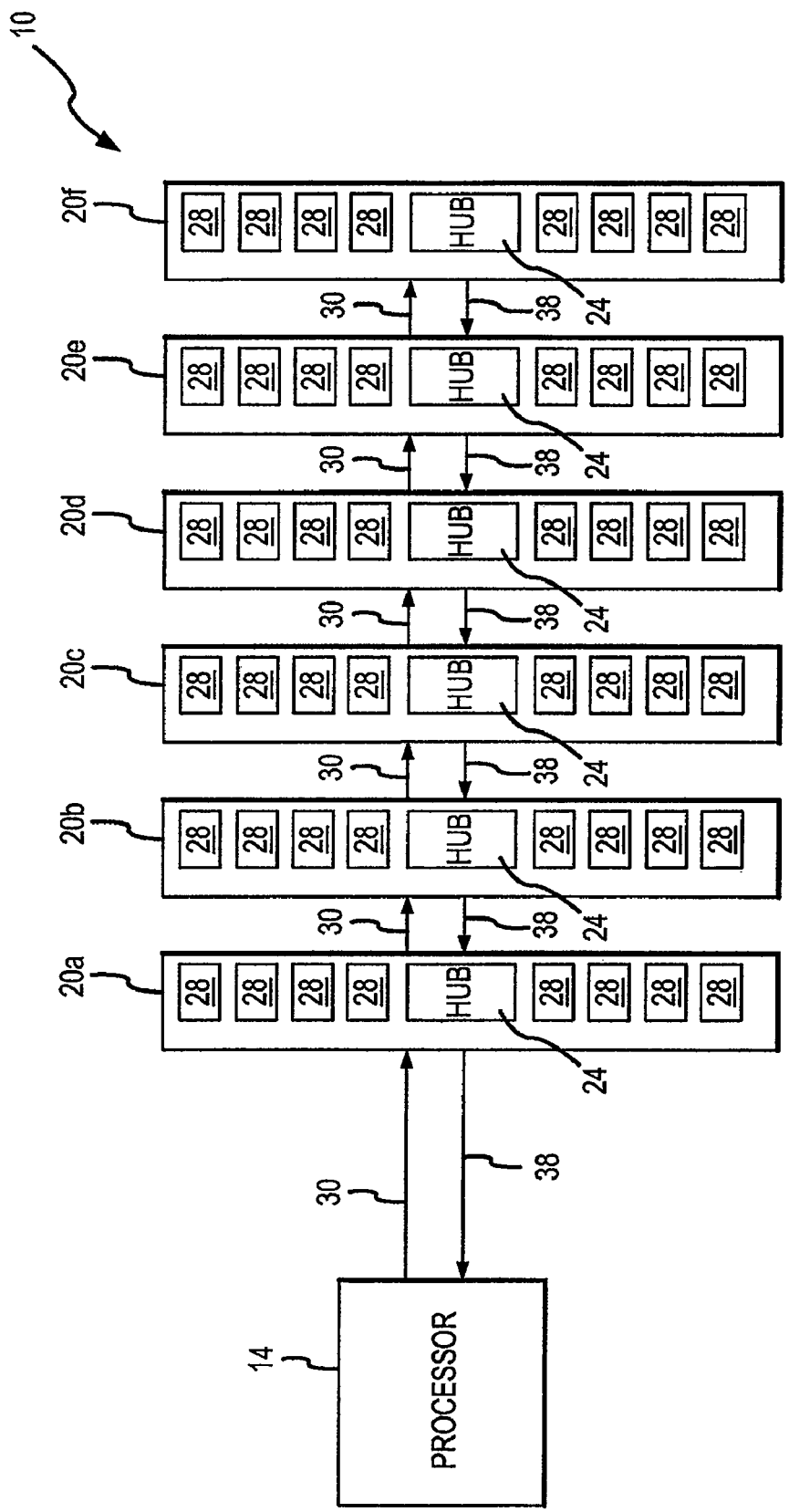
FIG. 1 is a block diagram of a conventional processor-based electronic system including several memory modules each of which include a memory hub coupled to several memory devices.
Figure 2A:
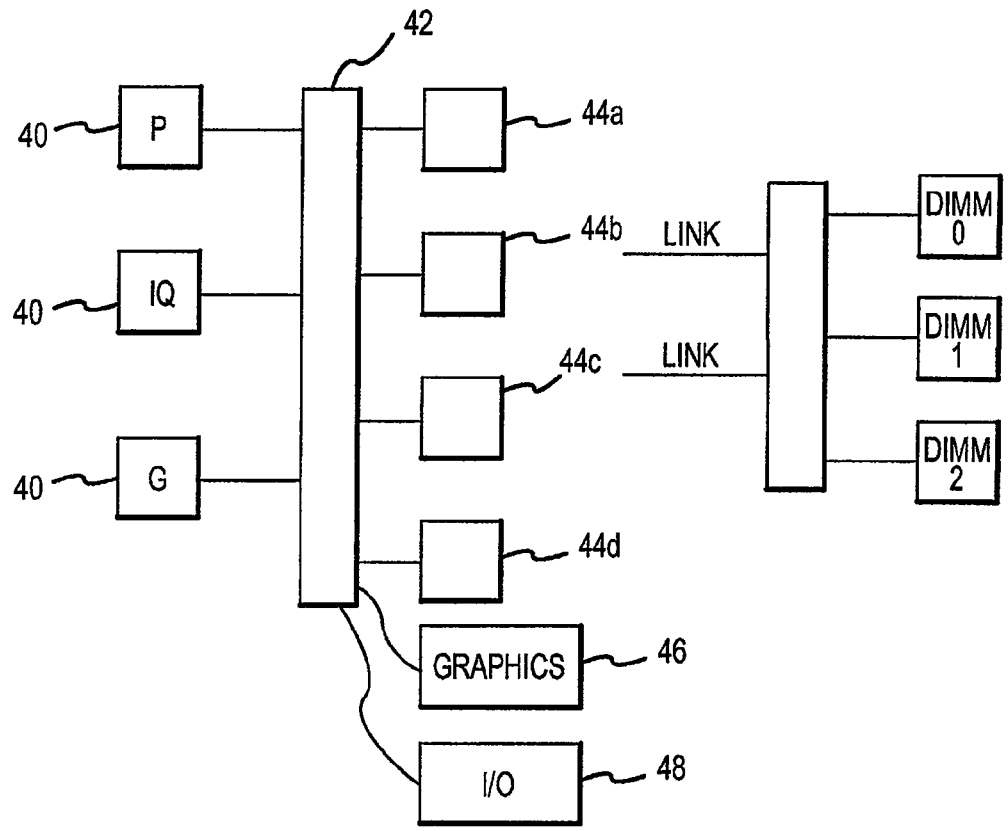
FIGS. 2A and 2B are block diagrams showing various conventional architectures for coupling memory modules to multiple processors.
Figure 2B:
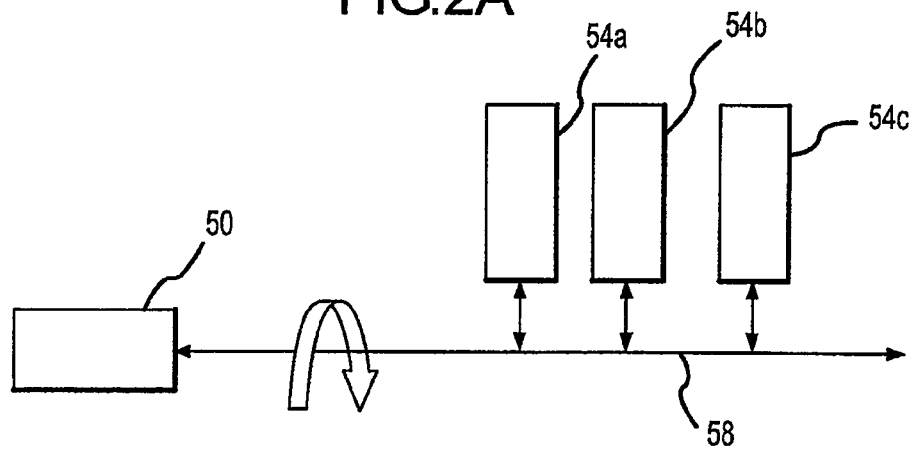
Figure 3:
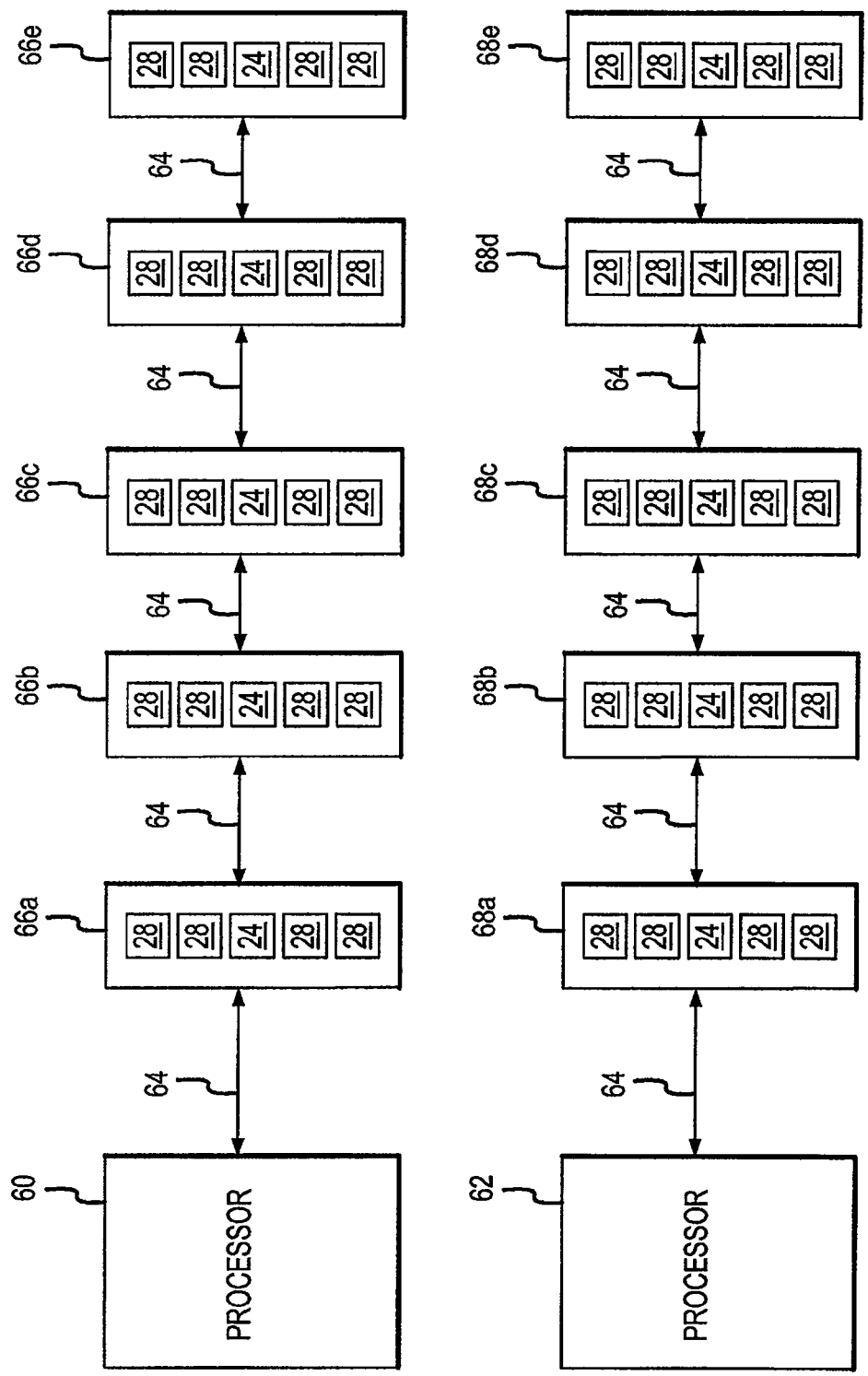
FIG. 3 is a block diagram of a conventional processor-based electronic system including multiple processors coupled to respective sets of memory modules each of which include a memory hub coupled to several memory devices.

138. This close proximity between the processors 102-106 and the memory modules 132-138, 212-218 and between the DMA device 108 and the memory modules 132-138, 212-218 results in a relatively low latency compared to latencies that are achievable with memory architectures of the type illustrated in FIGS. 1 and 3.

An additional advantage of the memory topography shown in FIG. 4 is that the data bandwidth between any of the processors 102-106 or the DMA device 108 and any of the memory modules 212-218 in the second rank 210 can be varied by simply varying the number of interconnections to the memory modules 212-218. For example, if each of the buses are 16-bits wide, the processor 106 can be coupled to any of the memory modules 212-218 through a 16-bit data bus by using only a single one of the buses extending from the processor 106 to one of the modules 132-138 and a single one of the buses extending from one of the modules 132-138 to one of the modules 212-218. The processor 106 can be coupled to any of the memory modules 212-218 through a 32-bit data bus by being coupled to two of the modules 132-138, and from each of these two modules 132-138 to one of the modules 212-218 though a respective bus. The processor 106 can be coupled to any of the memory modules 212-218 through a 48-bit data bus by being coupled to three of the modules 132-138, and from each of these three modules 132-138 to one of the modules 212-218 though a respective bus. Finally, the processor 106 can be coupled to any of the memory modules 212-218 through a 64-bit data bus by being coupled to all four of the modules 132-138, and from each of these four modules 132-138 to one of the modules 212-218 though a respective bus.

Figure 5:
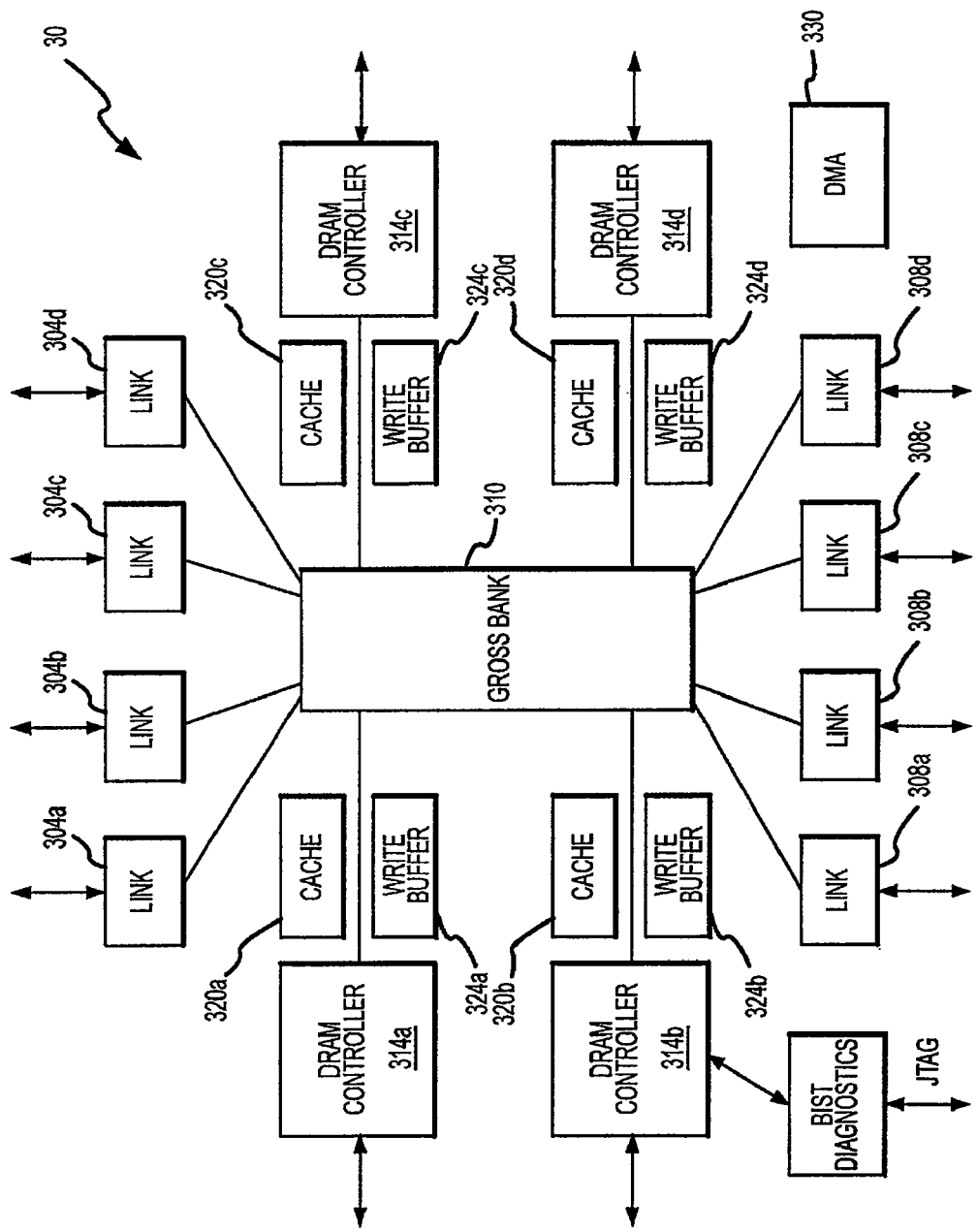
FIG. 5 is a block diagram of a memory module that can be used in the processor-based systems of FIGS. 4 and 6.

One embodiment of a memory hub 300 that may be used in the memory modules 132-138, 212-218 of FIG. 4 is shown in FIG. 5. The memory hub 300 includes four link interfaces 304a-d that are coupled to respective buses, such as the buses in the first set shown in FIG. 4. Similarly, four additional link interfaces 308a-d are included that are also coupled to respective buses, such as the buses in the second set shown in FIG. 4. All of the link interfaces 304, 308 are coupled to a cross bar switch 310, which may be of a conventional or hereinafter developed design. The cross bar switch 310 can couple any of the link interfaces 304a-d to any of the link interfaces 308-a-d, as previously explained with respect to FIG. 4. The link interfaces 304a-d, 308a-d may be either unidirectional or duplex interfaces, and the nature of the memory accesses coupled to or from the link interfaces 304a-d, 308a-d may vary as desired, including conventional DRAM address, control and data signals, shared address and control signals and packetized memory access signals.

The cross bar switch 310 can also couple any of the link interfaces 304a-d, 308a-d to four DRAM controllers 314a-d, each of which is coupled to a plurality of DRAM devices (not shown in FIG. 5). The DRAM controllers 314a-d may be conventional DRAM controllers or some hereinafter developed design for a DRAM controller. The specific structure and operation of the DRAM controllers 314a-d will, of course, depend on the nature of the DRAM devices used in a memory module. The cross bar switch 310 couples the link interfaces 304a-d to the DRAM controllers 314a-d to allow any of a plurality of memory access devices to write data to or read data from DRAM devices coupled to the controllers 314a-d, as also explained above with reference to FIG. 5. The cross bar switch 310 couples the link interfaces 308a-d to the DRAM controllers 314a-d to allow any data to be transferred to or from DRAM devices coupled to the DRAM controllers 314a-d from or to, respectively, other memory modules containing a memory hub 300.

The memory hub 300 also includes a cache memory 320a-d and a write buffer 324a-d for each of the DRAM devices serviced by a respective DRAM controller 314a-d. As is well known in the art, each of the cache memories 320a-d, which may be a static random access memory ("SRAM") device, stores recently or frequently accessed data stored in the DRAM devices serviced by the respective DRAM controller 314a-d. The write buffers 324a-d accumulate write addresses and data directed to DRAM devices serviced by a respective one of the DRAM controllers 314a-d if the DRAM devices are busy servicing a read memory request or there are other read requests pending. By accumulating the write memory requests in this manner, they can be processed more efficiently in a pipelined manner since there is no need to incurs delays associated with alternating write and read requests.

As mentioned above, data can be transferred from one memory module containing a memory hub 300 to another memory module containing a memory hub 300. These inter-module data transfers are controlled by a direct memory access ("DMA") engine 330, which may be of a conventional or hereinafter developed design. The DMA engine 330 may also be used to transfer data from a partially defective memory module to a properly functioning memory module prior to disabling the operation of the partially defective memory module.

The memory hub 300 will generally include components in addition to those shown in FIG. 5. However, these have been omitted in the interest of brevity or clarity. Also, in some applications, components shown in FIG. 5 may be omitted. For example, the write buffers 324a-d may be omitted if write/read access turnovers are acceptable. Also, although the memory hub 300 shown in FIG. 5 includes two sets of four link interfaces 304a-d, 308a-d and four DRAM controllers 314a-d, the number of sets of link interfaces, the number of link interfaces in each set and the number of DRAM controllers may vary as desired.

Figure 6:
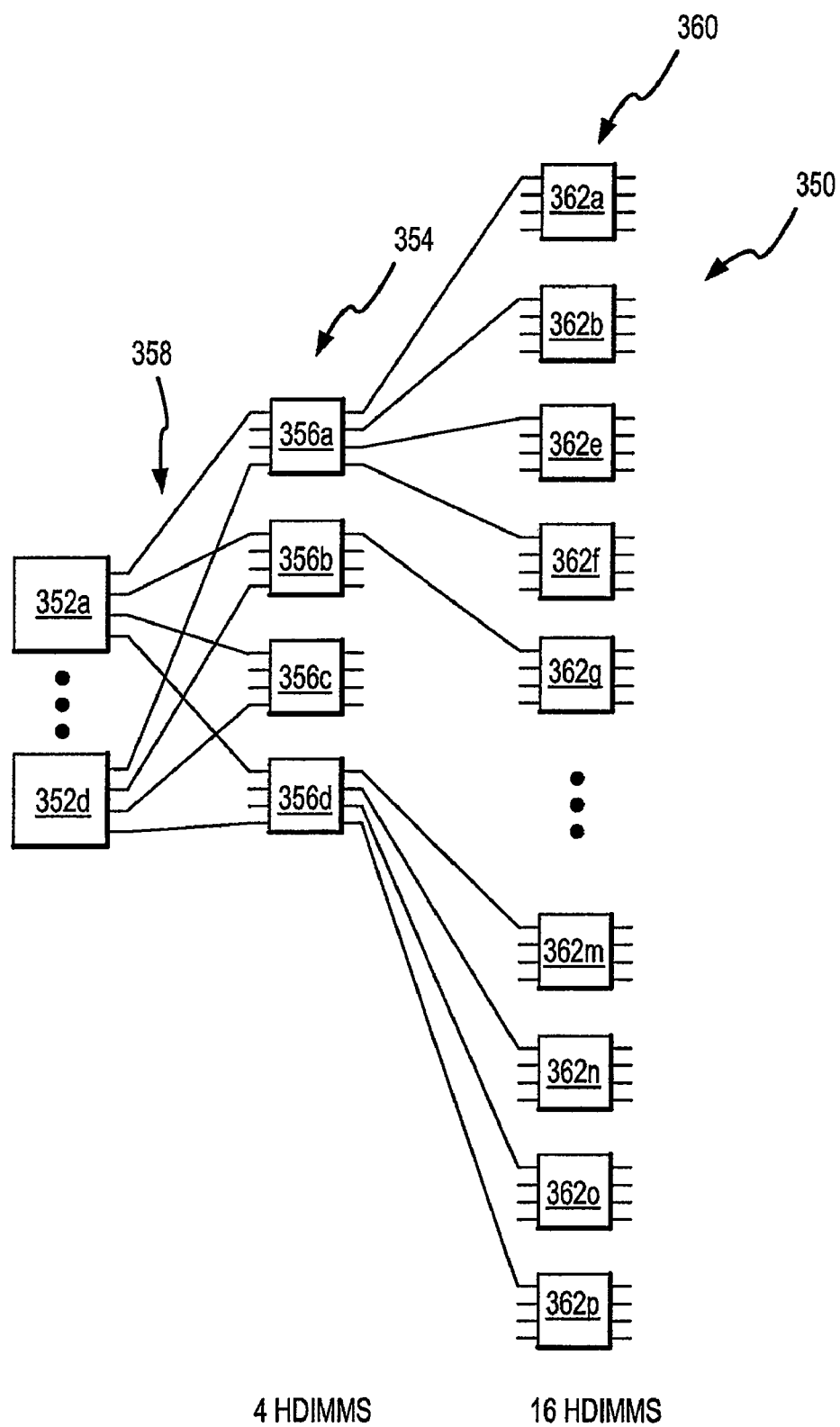
FIG. 6 is a block diagram of a processor-based system coupled to several memory modules according to another embodiment of the invention.

An alternative embodiment of a processor-based electronic system 350 is shown in FIG. 6. The system 350 includes four memory requestors 352a-d, such as processors or direct memory access devices, each of which is coupled to a first rank 354 of four memory modules 356a-d through buses, generally indicated at 358. The memory modules 356a-d are thus configured in the same manner as in the embodiment of FIG. 4. However, rather than coupling each of the memory modules 356 in the first rank 354 to each of the memory modules in a second rank of memory modules as in the embodiment of FIG. 4, the memory modules 356a-d are each coupled to a respective set of four memory modules in a second rank 360. Thus, the first memory module 356a is coupled to four memory modules 362a-d, the second memory module 356b is coupled to four memory modules 362e-h, the third memory module 356c is coupled to four memory modules 362i-l, and the fourth memory module 356d is coupled to four memory modules 362m-p. The advantage of the topography shown in FIG. 6 over the topography shown in FIG. 4 is that the second rank 360 of memory modules 362 provide a larger memory capacity than the memory modules in the second rank 210 using the topography shown in FIG. 4. However, a disadvantage of the memory topography shown in FIG. 6 is that it provides less bandwidth and flexibility in accessing the memory modules 362 in the second rank 360.

From the foregoing it will be appreciated that, although specific embodiments of the invention have been described herein for purposes of illustration, various modifications may be made without deviating from the spirit and scope of the invention. For example, although the processors 104-108 and the DAM device 110 are shown as being coupled directly to the memory modules 132-138, it will be understood that they may be coupled through other devices, such as bus bridges. Also, the systems 100, 350 shown in FIGS. 4 and 6, respectively, would normally include components in addition to those shown. Accordingly, the invention is not limited except as by the appended claims.

What is claimed is:

1. A memory system, comprising:
a plurality of memory requestors; and
a first rank containing a plurality of memory modules each of which comprises: a plurality of memory devices;
a memory hub coupled to a plurality of the memory requestors, to a port, and to the memory devices in the memory module, the memory hub in each of the memory modules being configured to allow any of the memory requestors to access the memory devices to which it is coupled and to communicate with the port of the memory hub; and
a second rank containing a plurality of memory modules each of which comprises:
a plurality of memory devices; and
a memory hub coupled to the memory devices in the memory module and to the respective port of the memory hub in each of a plurality of the memory modules in the first rank, the memory hub in each of the memory modules in the second rank being configured to allow any of the memory requestors to access the memory devices to which it is coupled through at least one memory module in the first rank.

2. The memory system of claim 1 wherein the memory hub in each of the memory modules in the second rank includes a plurality of memory ports corresponding in number to the number of memory modules in the first rank, the memory ports in the memory hub in each of the memory modules in the second rank being coupled to the memory modules in the first rank through respective ones of the memory ports.

3. The memory system of claim 1 wherein the memory hub in each of the memory modules in the first rank comprise a cross bar switch operable to couple any of the memory requesters to any of the memory devices to which it is connected and to the memory hub in any of the memory modules in the second set.

4. A memory system, comprising:
a plurality of memory requestors;
a first rank of memory modules each of which is coupled to the plurality of memory requestors, each of the memory modules in the first rank comprising a plurality of memory devices and being configured to allow any of the memory requestors to which it is coupled to selectively access the memory device in the memory module, the memory module further comprises a port configured to selectively communicate with any of the memory requestors to which the memory module is coupled; and
a second rank of memory modules each of which is coupled to the memory modules in the first rank through the respective ports of the memory modules in the first rank, each of the memory modules in the second rank comprising a plurality of memory devices and being configured to allow any of the memory requestors to selectively access the memory device in the memory module through at least one of the memory modules in the first rank.

5. The memory system of claim 4 wherein each of the memory devices comprises a dynamic random access memory device.

6. The memory system of claim 4 wherein each of the memory modules further comprises a respective cache memory device.

7. The memory system of claim 4 wherein each of the memory modules further comprises a respective write buffer configured to receive write data and associated write addresses from each of the memory requesters and to store the write data and addresses for subsequent coupling to at least some of the memory device in the memory module.

8. The memory system of claim 7 wherein each of the write buffers is configured to accumulate write data and addresses for a plurality of write memory accesses and then sequentially couple the plurality of write data and addresses to at least some of the memory devices in the memory module without any intervening read memory accesses.

9. The memory system of claim 4 wherein each of the memory modules further comprise a direct memory access device configured to access at least some of the memory device in the memory module.

10. The memory system of claim 4 wherein at least some of the memory requesters comprise a processor.

11. The memory system of claim 4 wherein at least some of the memory requesters comprise a direct memory access device.

12. A system, comprising:
a plurality of memory requestors;
a first rank of memory modules coupled to the memory requestors, the memory modules in the first rank each including a first set of memory ports coupled to a respective one of the memory requestors, the memory modules in the first rank further including a second set of memory ports, each of the memory modules in the first rank including a plurality of memory devices; and
a second rank of memory modules each including at least one memory port coupled to a memory module in the first rank through a memory port in the second set, each of the memory modules in the second rank including a plurality of memory devices, each of the memory modules in the second rank being accessed by at least one of the memory requestors through at least one of the memory modules in the first rank, the memory modules in the first set being configured to allow the number of memory modules in the first rank through which the at least one memory module in the second rank is accessed to be adjustable to vary the data bandwidth between the at least one memory requestor and the at least one memory module in the second rank.

13. The system of claim 12 wherein the number of ports in the second set of each of the memory modules in the second rank corresponds in number to the number of modules in the first rank.

14. The system of claim 12 wherein the number of ports in the first set of each of the memory modules in the first rank corresponds in number to the number of memory requestors.

15. A system, comprising;
a plurality of memory requestors;
a first rank of memory modules coupled to the memory requestors, the memory modules in the first rank each including a first set of memory ports corresponding in number to the number of memory requestors, each of the memory ports in the first rank being coupled to a respective one of the memory requestors, the memory modules in the first rank further including a second set of memory ports, each of the memory modules in the first rank including a plurality of memory devices; and a second rank of memory modules each including a plurality of memory devices and at least one memory port coupled to a memory module in the first rank through a memory port in the second set, each of the memory modules in the second rank being accessed by at least one of the memory requestors through at least one of the memory modules in the first rank.

16. The system of claim 15 wherein each of the memory modules in the second rank includes a plurality of memory ports corresponding in number to the number of memory modules in the first rank, the memory ports in each of the memory modules in the second rank being coupled to the memory modules in the first rank through respective memory ports in the second set.

17. The system of claim 15 wherein each of a plurality of sets of memory modules in the second rank are coupled to a respective one of the memory modules in the first rank, each of the memory modules in the first rank including a memory port coupled to the memory module in the first rank to which the respective set of memory modules in the second rank corresponds.

* * * * *

UNITED STATES PATENT AND TRADEMARK OFFICE
CERTIFICATE OF CORRECTION

PATENT NO.         : 7,873,775 B2                                    Page 1 of 1
APPLICATION NO.    : 12/505933
DATED              : January 18, 2011
INVENTOR(S)        : Joseph M. Jeddeloh It is certified that error appears in the above-identified patent and that said Letters Patent is hereby corrected as shown below:

Column 2, line 13, "system" should read --systems--.
    Column 2, line 42, "number a data" should read --number of data--.
    Column 2, line 45, "are also" should read --is also--.
    Column 3, line 6, "an that allows multiple processor" should read --and that allows multiple processors--.
    Column 3, line 23, "include" should read --includes--.
    Column 3, line 41, "include" should read --includes--.
    Column 3, line 49, "include" should read --includes--.
    Column 3, line 66, "includes" should read --include--.
    Column 4, line 1, "ports" should read --port--.
    Column 5, line 13, "buses are" should read --buses is--.
    Column 6, line 15, "incurs" should read --incur--.
    Column 6, line 57, "provide" should read --provides--.
    Column 7, line 1, "DAM" should read --DMA--.
    Column 8, line 9, "device" should read --devices--.
    Column 8, line 19, "device" should read --devices--.
    Column 10, line 5, "are" should read --is--.

Signed and Sealed this
Twentieth Day of March, 2012

David J. Kappos
*Director of the United States Patent and Trademark Office*